United States Patent [19]

Daikoku

[11] Patent Number: 5,678,218
[45] Date of Patent: Oct. 14, 1997

[54] CIRCUIT FOR REMOVING RANDOM FM NOISE

[75] Inventor: Kazuhiro Daikoku, Tokyo, Japan

[73] Assignee: Nippon Telegraph and Telephone, Tokyo, Japan

[21] Appl. No.: 511,323

[22] Filed: Aug. 4, 1995

Related U.S. Application Data

[63] Continuation of PCT/JP94/00169, Feb. 4, 1994.

[30] Foreign Application Priority Data

Feb. 5, 1993 [JP] Japan .................... 5-018987

[51] Int. Cl.$^6$ ............................................ H04B 1/12
[52] U.S. Cl. .................. 455/278.1; 455/306; 455/308; 455/314
[58] Field of Search .............................. 455/203, 278.1, 455/296, 303, 305, 306, 308, 309, 307, 311, 314

[56] References Cited

U.S. PATENT DOCUMENTS

| | | |
|---|---|---|
| 4,803,739 | 2/1989 | Daikoku et al. . |
| 4,901,150 | 2/1990 | Klingelhofer et al. ............ 455/308 |
| 4,989,262 | 1/1991 | Saito .............................. 455/303 |
| 5,300,838 | 4/1994 | Elizondo ......................... 455/314 |
| 5,410,750 | 4/1995 | Cantwell et al. ................. 455/306 |

FOREIGN PATENT DOCUMENTS

| | | |
|---|---|---|
| 56-78250 | 6/1981 | Japan . |
| 63-48018 | 2/1988 | Japan . |
| 1-221022 | 9/1989 | Japan . |
| 1-42535 | 9/1989 | Japan . |
| 3-268616 | 11/1991 | Japan . |

OTHER PUBLICATIONS

K. Daikoku et al "RZ SSB Transceiver with Equal–Gain Combiner for Speech and Data Transmission, IEEE Global Telecommunications Conf. and Exhibition", Nov. 28–Dec. 1, 1988 pp. 820–824.

J. Mcgeehan et al, "Theoretical and Experimental Investigation of Feedforward Signal Regeneration as a Means . . . ", IEEE Transaction on Vehiclur Tech. vol. VT32 No. 1, Feb. 1983 pp. 106–121.

W.C.Jakes Jr., "Fundamental of diversity systems", Microwave Mobile Communications, 1974, pp. 309–387.

W.C.Jakes Jr., "Diversity Techniques", Microwave Mobile Communication, 1974, pp. 388–545.

*Primary Examiner*—Chi H. Pham
*Attorney, Agent, or Firm*—Cushman, Darby & Cushman IP Group of Pillsbury Madison & Sutro LLP

[57] ABSTRACT

A circuit which limits to a fixed value the amplitude of a pilot signal received along with a modulated signal, mixes the amplitude-limited pilot signal with the modulated signal, and uses the random FM noise contained in the pilot signal to cancel the random FM noise contained in the modulated signal. The desired signal to be received is selected from the input signal at the high frequency band; this output is converted to a low frequency band signal by means of a frequency converter. The extraction of the pilot signal and the cancellation of the random FM noise is performed in the low frequency band, whereby the characteristics required for the high frequency band-pass filter are relaxed.

10 Claims, 8 Drawing Sheets

First Embodiment

First Embodiment

Second Embodiment

Two — Branch Equal — Gain Combining Diversity Circuit

N — Branch Equal — Gain Combining Diversity Circuit

N-Branch Maximum Ratio Combining Diversity Circuit

N − Branch Selective Combining Diversity Circuit

Embodiment Employing DSP

Procesing Signal Flow for DSP

Measurement of Random FM Noise Cancellation Characteristics

SINAD Characteristics

CIRCUIT FOR REMOVING RANDOM FM NOISE

This application is a continuation of international application PCT/JP94/00169, filed Feb. 4, 1994, which designated the U.S. and is incorporated herein by reference along with the priority application No. 5-18987 filed Feb. 5, 1993 in Japan.

TECHNICAL FIELD

This invention is utilized to improve the quality of radio communications, and relates in particular to a radio communication system capable of receiving high-quality signals even through a mobile radio environment constantly subject to severe fading.

BACKGROUND TECHNOLOGY

A known method for eliminating random FM noise encountered in mobile radio communication propagation paths is to utilize a pilot signal inserted in the vicinity of the modulated signal. In this method, after the pilot signal degraded by a random FM noise through fading is first extracted using a narrow-band filter and then is frequency-converted by being mixed with the output of a local oscillator, its amplitude is limited by an amplitude limiter, whereupon the random FM noise is eliminated by using a frequency converter for difference frequency mixing of this signal and the modulated signal containing the pilot signal degraded by the random FM noise. A feed-forward circuit configuration is used for this.

Previous publications by the present inventors includes:

(1) Japanese Patent Disclosure 1-21022

(2) Japanese Patent Disclosure 3-268616

(3) U.S. Pat. No. 4,803,739

(4) K. Daikoku and K. Suwa, "RZ SSB Transceiver with Equal-Gain Combiner for Speech and Data Transmission", IEEE Global Telecommunications Conf., p.26.4.1, Hollywood, Fla., Nov.28–Dec. 1, 1988.

Previous publications by others include:

(5) Joseph P. McGeehan and Andrew J. Bateman, "Theoretical and Experimental Investigation of Feed-forward Signal Regeneration as a Means of Combating Multipath Propagation Effects in Pilot-Based SSB Mobile Radio Systems", IEEE Trans. on Vehicular Technology, Vol. VT-32, No. 1, pp. 106–120, February 1983

(6) Japanese Patent Disclosure 1-42535 (WO81/00495)

(7) Ed. William C. Jakes Jr., "Microwave Mobile Communications", New York, John Wiley & Sons, Inc. (1974), Chapter 5 Fundamentals of Diversity Systems; Chapter 6 Diversity Techniques.

The technology disclosed in Reference 1 has various shortcomings: for example, because the random FM noise canceler is not integrated with the selective amplifier, there are a large number of components. Reference 2 remedies these shortcomings and integrates the random FM noise canceler and the selective amplifier. Reference 3 is a fundamental patent on RZ SSB systems, and indicates that an SSB signal can be demodulated by a different method from the conventional one: namely, by means of a PM demodulator and a linearizer, the PM demodulator comprising an amplitude limiter, a frequency discriminator and an integrator. Reference 4 examines the data signal transmission characteristics of an RZ SSB system, and reports that excellent transmission characteristics can be obtained in mobile radio environments constantly subject to severe fading, using the same information bandwidth as in telephony, i.e., from 300 Hz to 3.4 kHz, in a 5 kHz channel spacing. Reference 5 reports research carried out at the University of Bristol U.K., and concerns an SSB system having a pilot signal placed within the information signal band. For this reason, this method is called a transparent tone-in-band (TTIB). It is featured in that the received signal degraded by fading encountered in the land mobile radio environments is remedied by using both an automatic gain control (AGC) and an automatic frequency control (AFC) circuit in the receiver. This method is called a feed-forward sisal regeneration (FFSR) owing that a random FM noise is eliminated using a feed-forward circuit configuration. The technology disclosed in Ref. 6 is similar to the FFSR technology described in Ref. 5. Reference 7 covers detailed descriptions on the entire range of diversity techniques including a random FM noise cancellation.

However, a previously developed feed-forward configuration possesses various problems, such that the delay characteristics of a narrow-band filter for extracting the pilot signal are not adequately equalized. As a result, it is impossible to reduce the random FM noise below a certain level.

It might be considered that the random FM noise can be adequately eliminated by using a narrow-band filter of which delay characteristics are well equalized. However, it is often difficult, in a working frequency region, to realize a flat-delay equalization for the narrow-band filter for extracting the pilot signal.

It is also generally difficult to implement, in the frequency region that is to be utilized, a small and inexpensive narrow-band filter for pilot signal extraction, the filter having amplitude characteristics that remain constant over a wide range of temperatures.

Furthermore, in mobile radio communication systems it is necessary to remove signals outside the desked channel by means of sharp receiving filters. However, it has been difficult to obtain small and inexpensive filters suitable for narrow-band mobile radio communications, with amplitude characteristics that are invariable over a wide range of temperatures.

It is an object of the present invention to overcome such problems and to provide a radio communication method and device which can thoroughly eliminate random FM noise caused by fast fading, and can also obtain high-quality received signals by thoroughly eliminating signals outside the desired channel. It is a further object of this invention to provide a random FM noise canceler which can be utilized for equal-gain combining diversity, maximum ratio combining diversity, or selective combining diversity circuits.

SUMMARY OF THE INVENTION

A random FM noise canceler according to this invention has a random FM noise canceler including:

a first filter means which extracts a modulated signal containing a pilot signal from an input signal in a high frequency band (RF band or IF band). A second filter means extracts the pilot signal from the output of this first filter means. An amplitude limiting means substantially limits the amplitude of the extracted pilot signal to a fixed value. A noise cancellation means cancels the random FM noise component contained in both the modulated and the pilot signals by frequency-mixing the output of this amplitude limiting means with the signal extracted by the first filter means. A delay equalizing means equalizes the delay times of the two signals that are input to this noise cancellation means.

The first filter means comprises:

a first band-pass means which selects the desired signal to be received from the input signal at the high frequency band. An input frequency conversion means converts the output of this first band-pass means to a low frequency band (AF band) signal; and a second band-pass means extracts the modulated signal containing the pilot signal from this low frequency band signal.

One or the other of the inputs to the noise cancellation means must be frequency-converted so that the modulated signal (containing the pilot signal) and the pilot signal have different frequency carriers. Usually, it is the pilot signal that is frequency-converted. In other words, there should be a means which converts the frequency of the extracted pilot signal and supplies the result to the amplitude limiting means.

The pilot signal contained in the input signal may be a signal transmitted without modulation from the transmitting side at a frequency close to the carrier frequency of the modulated signal, or it may be the carrier itself. If the modulated signal contained in the input signal is a single sideband signal with a diminished-carrier and an RZ SSB demodulation scheme is employed, there should be a means which amplifies the extracted pilot signal and a means which adds the amplified pilot signal to the low frequency band modulated signal; and the delay equalizing means should include a delay circuit which equalizes the delay due to the second filter means and the amplifying means.

The desired signal is selected from an input signal at a high frequency band, and is frequency-converted to a low frequency band, in which a modulated signal with a pilot signal is obtained. Because a band limitation is not carried out at a radio frequency stage only, the band limitation requirements for the radio frequency stage band-pass filter are relaxed, and the requirements as regards operating temperature range are also relaxed. In the case of the low frequency band-pass filter, it is easy to obtain band characteristics that are constant over the entire operating temperature range.

DETAILED DESCRIPTION OF PRESENTING PREFERRED EMBODIMENTS

Figure 1:
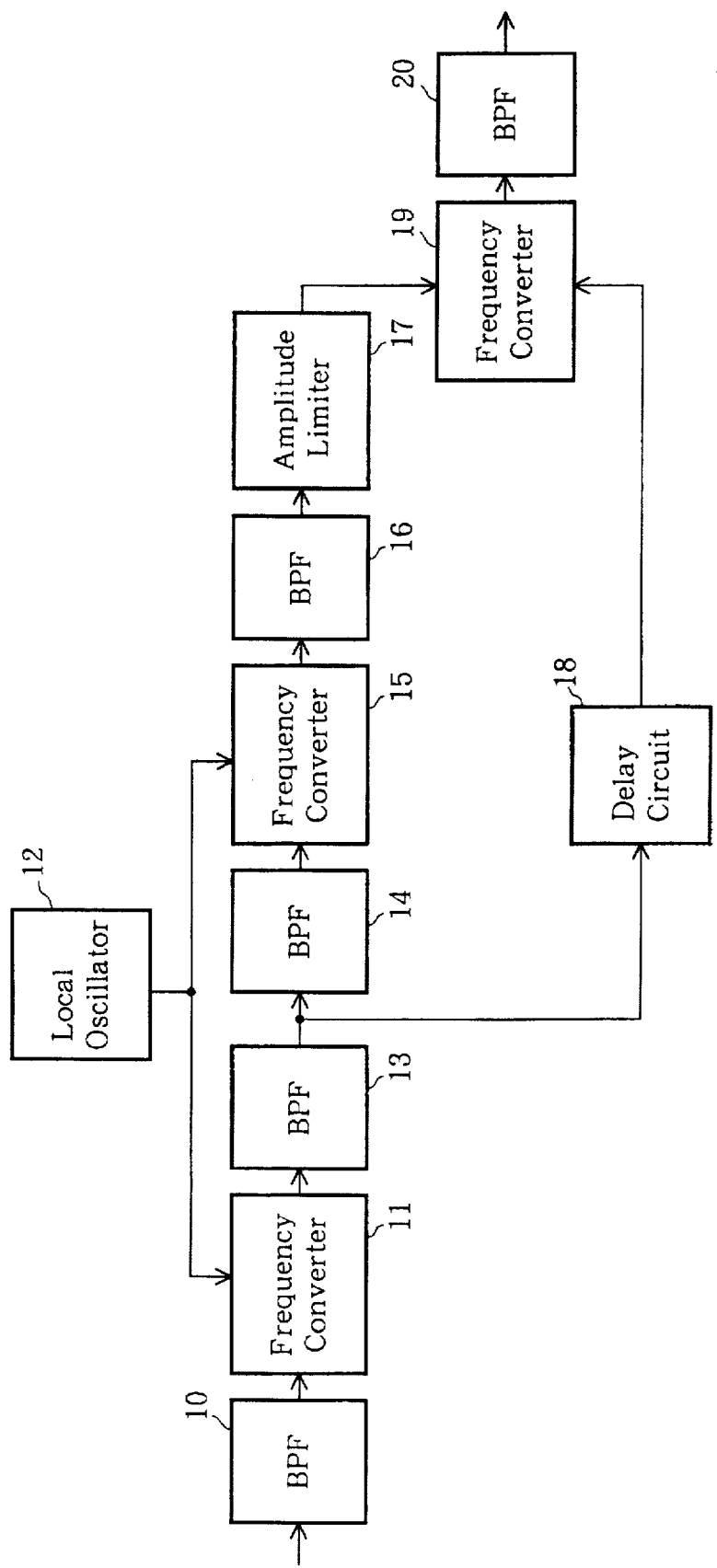
FIG. 1 is a block diagram showing a random FM noise canceler according to a first embodiment of this invention.

FIG. 1 is a block diagram showing a random FM noise canceler according to a first embodiment of this invention.

This device comprises a band-pass filter 14 serving as the second filter means which extracts the pilot signal from the modulated signal containing the pilot signal. An amplitude limiter 17 serves as the amplitude limiting means that substantially limits the amplitude of the extracted pilot signal to a fixed value. A frequency converter 19 and band-pass filter 20 serve as the noise cancellation means which cancels the random FM noise component contained in both the modulated signal and the pilot signal by frequency-mixing the output of this amplitude limiter 17 with the modulated signal containing the pilot signal. Delay circuit 18 serves as the delay equalizing means which equalizes the delay times of the two signals that are put into the noise cancellation means.

The distinguishing features of this embodiment are that it has. A band-pass filter 10 serving as the first band-pass means which selects the desired signal to be received from the input signal at the high frequency band. A frequency converter 11 and local oscillator 12 serves as the input frequency conversion means which converts the output of band-pass filter 10 to a low frequency band signal. Band-pass filter 13 serves as the second band-pass means which extracts the modulated signal containing the pilot signal from this low frequency band signal. Frequency converter 15 and band-pass filter 16 are also provided, as the means which converts the frequency of the pilot signal that has been extracted by band-pass filter 14 and supplies the result to amplitude limiter 17.

The operation of this embodiment will be explained for the case where the frequency of a pilot signal close to the carrier frequency of the modulated signal is transmitted from the transmitting side without modulation.

The pilot and the modulated signal are fed into band-pass filter 10. Band-pass filter 10 rejects to some extent signals invading from adjacent channels, but does not produce any attenuation in the desired channel. Frequency converter 11 converts the frequency of the output signal from band-pass filter 10 to the low frequency band by means of the output signal from local oscillator 12. Band-pass filter 13 removes, from the signal resulting from the frequency conversion, any signals outside the desired channel, the removal being performed up to the level required by the system. Band-pass filter 14 extracts the frequency-converted pilot signal. Frequency converter 15 converts the frequency of the output signal from band-pass filter 14 by means of the output signal of local oscillator 12, and band-pass filter 16 removes spurious components. Through this process, the pilot signal at the high frequency band can be obtained. Amplitude limiter 17 forms a signal with fixed amplitude and supplies it to frequency converter 19 as a pseudo local signal.

The output of band-pass filter 13 is supplied to frequency converter 19 after being delayed by delay circuit 18 by a time equal to the delay time introduced by band-pass filters 14 and 16. Frequency converter 19 performs frequency conversion so as to obtain the difference frequency between the pseudo local signal from amplitude limiter 17 and the signal that has come via delay circuit 18. The random FM noise is eliminated through this process. Band-pass filter 20 removes the spurious components contained in the output of frequency converter 19.

A modulated signal with a pilot signal from which a random FM noise has been eliminated is thus formed as the output of band-pass filter 20.

In this embodiment, the main band limitation required for the communication equipment is achieved by using two band-pass filters 10 and 13. In conventional equipment, the main band limitation is often done by using a single band-pass filter at a high frequency band. In this case, the filter must maintain the band characteristics required for the communication equipment over the entire range of operating temperature. However, in the case of narrow band radio communications, it is difficult to keep these characteristics in the receiver. In the present embodiment, therefore, the band limitation is first of all carried out by band-pass filter 10 at the high frequency band, so that the dynamic range of band-pass filter 13 at the low frequency band can be well relaxed enough to suppress the level of undesired signals coming from adjacent channels. The main band limitation required by the communication device is then performed accurately by band-pass filter 13. This arrangement gives a number of advantages. First, the requirement of operating temperature range for band-pass filter 10 at the high frequency band can be relaxed, and the necessary qualities can easily be realized. Second, the accurate band limitation can be achieved because the band characteristics of band-pass filter 13 at the low frequency band can be secured without any fluctuation over the entire operating temperature range. Furthermore, a reduction in size is possible because LSI circuits can be easily introduced.

Furthermore, it is easy to design and implement a band-pass filter with flat delay characteristics which are easily equalized using delay circuit 18, because band-pass filter 14 operates at the low frequency band.

The operation of the first embodiment will now be explained using mathematical equations. Firstly, it is assumed that the transmitted signal S(t) is:

$$S(t)=k \cos(\omega_p t)+A(t) \cos[\omega_c t+\omega(t)] \quad (1)$$

The first term is the pilot signal, and the second term is the modulated signal. When this signal propagates along a mobile radio propagation path and is put into the circuit shown in FIG. 1, it becomes:

$$S(t)=R(t)k \cos[\omega_p t+\delta\omega(t)+\alpha]+R(t)A(t) \cos[\omega_c t+\omega(t)+\delta\omega(t)+\alpha] \quad (2)$$

where $R(t)$ is a Rayleigh fading noise, $\delta\omega(t)$ is a random FM noise, and $\alpha$ is a phase.

Assuming that the angular frequency of local oscillator 12 is $\omega_0$ and that for the sake of simplicity its phase is zero, the signal that is frequency-converted by frequency converter 11 is:

$$S_1(t)=R(t)k \cos[(\omega_p-\omega_0)t+\delta\omega(t)+\alpha]+R(t)A(t) \cos[(\omega_c-\omega_0)t+\omega(t)+\delta\omega(t)+\alpha] \quad (3)$$

The signal extracted by band-pass filter 14 will be:

$$S_2(t)=R(t-\tau_1)k \cos[(\omega_p-\omega_0)(t-\tau_1)+\delta\omega(t-\tau_1)+\alpha]$$

$\tau_1$ is the delay time of band-pass filter 14, which is flatly equalized. The signal that is frequency-converted through frequency converter 15, is fed into band-pass filter 16 in order to extract the pilot signal. The pilot signal of which amplitude is limited by amplitude limiter 17 is expressed as:

$$S_3(t)=\cos[\omega_p(t-\tau_1-\tau_2)+\delta\omega(t-\tau_1-\tau_2)+\alpha] \quad (4)$$

$\tau_2$ is the delay time of band-pass filter 16. For the sake of simplicity, the amplitude of the output signal of amplitude limiter 17 is normalized to "1".

After the delay time $\tau_1+\tau_2$ generated from band-pass filters 14 and 16 is equalized using delay circuit 18 of which output signal is described as, $$S_5(t) = R(t-\tau_1-\tau_2) \times \quad (5)$$
$$\cos[(\omega_p-\omega_0)(t-\tau_1-\tau_2)+\delta\omega(t-\tau_1-\tau_2)+\alpha] +$$
$$R(t-\tau_1-\tau_2)A(t-\tau_1-\tau_2) \times$$
$$\cos[(\omega_c-\omega_0)(t-\tau_1-\tau_2)+\omega(t-\tau_1-\tau_2)+\delta\omega(t-\tau_1-\tau_2)+\alpha]$$

This signal can be difference-frequency-converted using the output signal of amplitude limiter 17 (given in Eq. 4) acting as a pseudo local signal through frequency converter 19. The result signal is then described as:

$$S_6(t) = R(t-\tau_1-\tau_2)\cos[\omega_0(t-\tau_1-\tau_2)] +$$
$$R(t-\tau_1-\tau_2)A(t-\tau_1-\tau_2) \times$$
$$\cos[(\omega_p-\omega_c+\omega_0)(t-\tau_1-\tau_2)-\omega(t-\tau_1-\tau_2)]$$

In other words, the random FM noise $\delta\omega(t-\tau_1-\tau_2)$ and the input phase $\alpha$ are eliminated.

Figure 2:
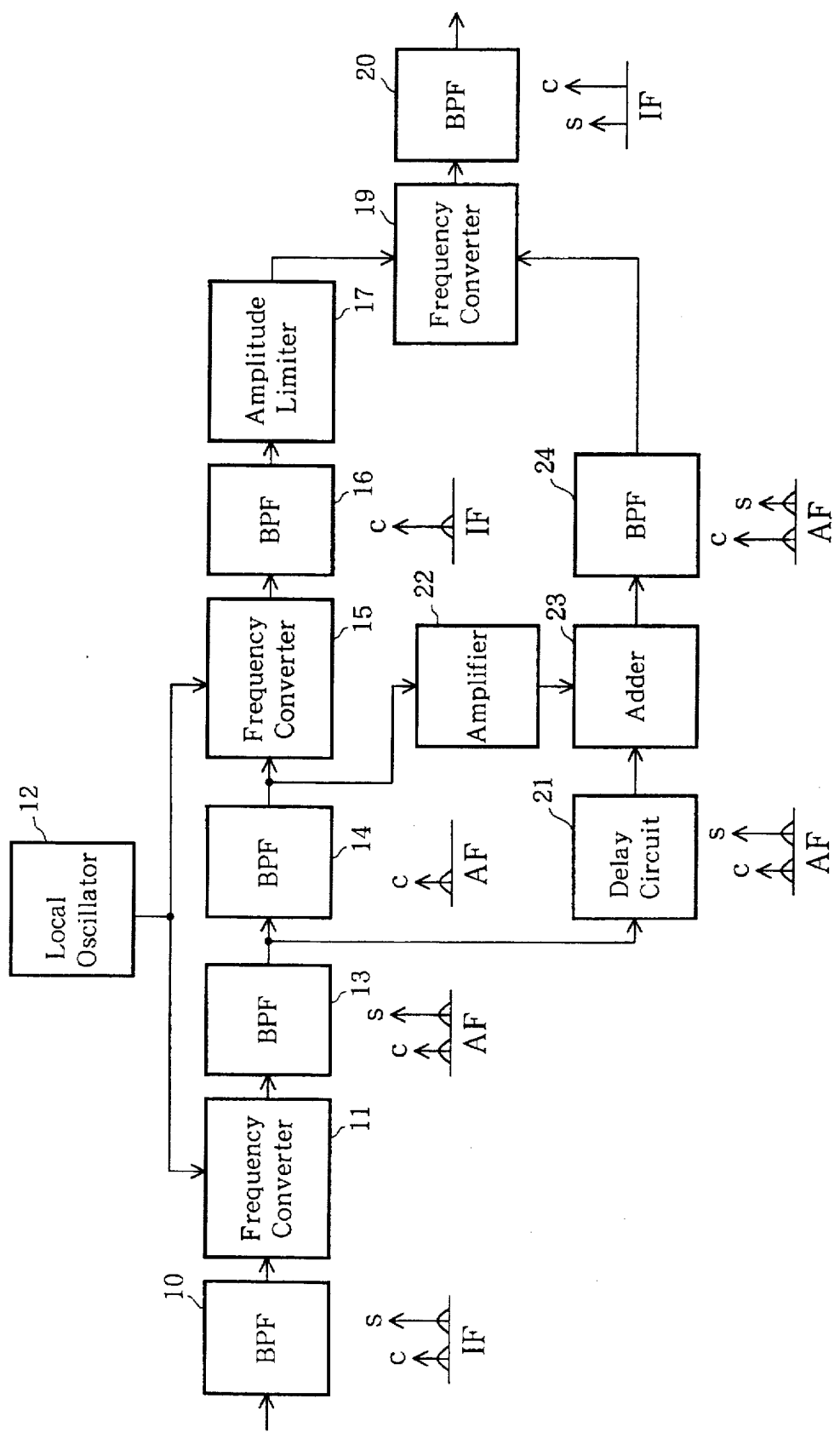
FIG. 2 is a block diagram showing a random FM noise canceler according to a second embodiment of this invention.

FIG. 2 is a block diagram showing a random FM noise canceler according to a second embodiment of this invention.

In this embodiment, the invention is implemented by means of an RZ SSB receiver. That is to say, the configuration shown is for the case where the input signal is a single sideband with a diminished-carrier and the carrier employed for the single sideband modulation process is introduced for the pilot signal. FIG. 2 shows illustrative spectra of modulated signal and the pilot signal (i.e., the carrier) in each part of circuits where the input signal is an IF band signal. The illustrative spectra includes the random FM noise component. In the case of RZ SSB, a full-carrier single sideband signal should be formed by amplifying only the pilot signal, the pilot signal being extracted by band-pass filter 14. Accordingly, in this embodiment there is provided amplifier 22 which amplifies the pilot signal that is extracted by band-pass filter 14, and adder 23 which adds the amplified pilot signal to the single sideband signal with the diminished-carrier at the low frequency band. The amplification gain of amplifier 22 should be set to get a full carrier single sideband signal, that is, the level of the pilot signal larger than that of modulated signal. Instead of delay circuit 18, there is provided a delay circuit 21 which equalizes the delay due to band-pass filter 14 and amplifier 22. Band-pass filter 24 is connected to the output of adder 23, thereby equalizing the delay due to band-pass filter 16.

The operation of this embodiment is similar to that of the first embodiment, and the signal obtained at the output of band-pass filter 20 has its random FM noise eliminated, with the single sideband with the dished-carrier convened to the full-carrier single sideband signal.

The operation of this embodiment as it relates to the pilot signal is the same as that of the first embodiment, except for $\omega_p=\omega_c$. Here, therefore, the mathematical equations can be used to explain the operation as it relates to the carrier side.

Because the delay time of band-pass filter 14 is equalized by delay circuit 21, the signal produced by adder 23 is:

$$S_4(t) = R(t-\tau_1)\cos[(\omega_c-\omega_0)(t-\tau_1)+\delta\omega(t-\tau_1)+\alpha] +$$
$$R(t-\tau_1)A(t) \times \cos[(\omega_c-\omega_0)(t-\tau_1)+\omega(t-\tau_1)+\delta\omega(t-\tau_1)+\alpha]$$

For the sake of simplicity, the amplitude of carrier component is normalized as "1". In order to produce a full-carrier single sideband, the gain of amplifier 22 is adjusted so that 1>max|A(t)|. As a result, the signal represented by Eq.5 and explained in the first embodiment will be obtained at the output of band-pass filter 24, and the signal obtained at the output of band-pass filter 20 is:

$$S_T(t) = R(t - \tau_1 - \tau_2)\cos[\omega_0(t - \tau_1 - \tau_2)] +$$

$$R(t - \tau_1 - \tau_2)A(t - \tau_1 - \tau_2) \times \cos[\omega_0(t - \tau_1 - \tau_2) - \omega(t - \tau_1 - \tau_2)]$$

Figure 3:
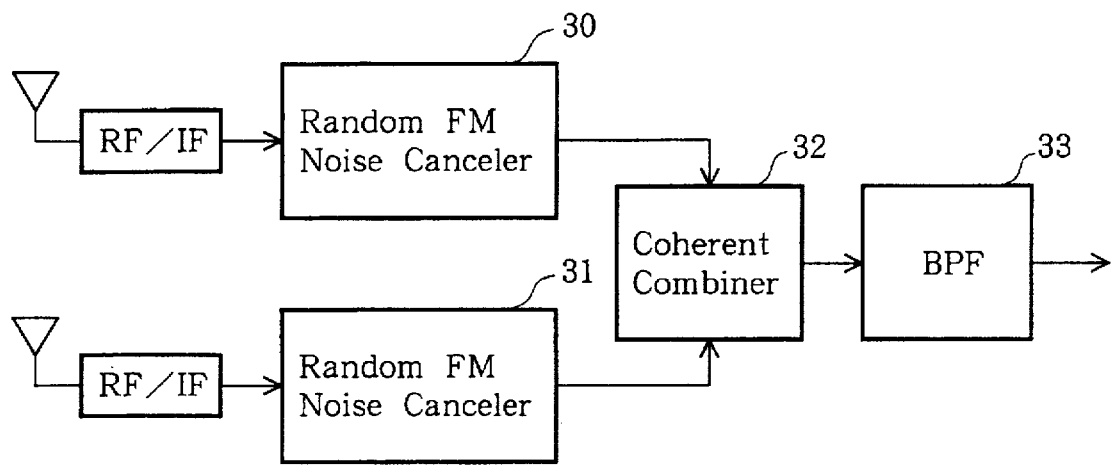
FIG. 3 is a block diagram showing an example of the utilization of this invention, and illustrates the configuration of a two-branch equal-gain combining diversity circuit.

FIG. 3 is a block diagram showing an example of the utilization of this invention, and illustrates a two-branch equal-gain combining diversity circuit where the total gain from the antenna to the random FM noise canceler of each branch is adjusted to be equal.

This circuit has, as random noise cancelers 30 and 31, two of the circuits taught in the first embodiment or the second embodiment. It also has coherent combiner 32 which coherently adds the respective output signals of these two random noise cancelers 30 and 31, and band-pass filter 33. The signals obtained at the outputs of random noise cancelers 30 and 31 have had their random FM noise and input phase eliminated. Accordingly, because the phase of these signals depends only on the phase generated in the receiver, the coherent combination can be carried out by coherent combiner 32. Spurious components in the added signal are removed by band-pass filter 33. It follows that an equal-gain combined signal is obtained at the output of band-pass filter 33.

Figure 4:
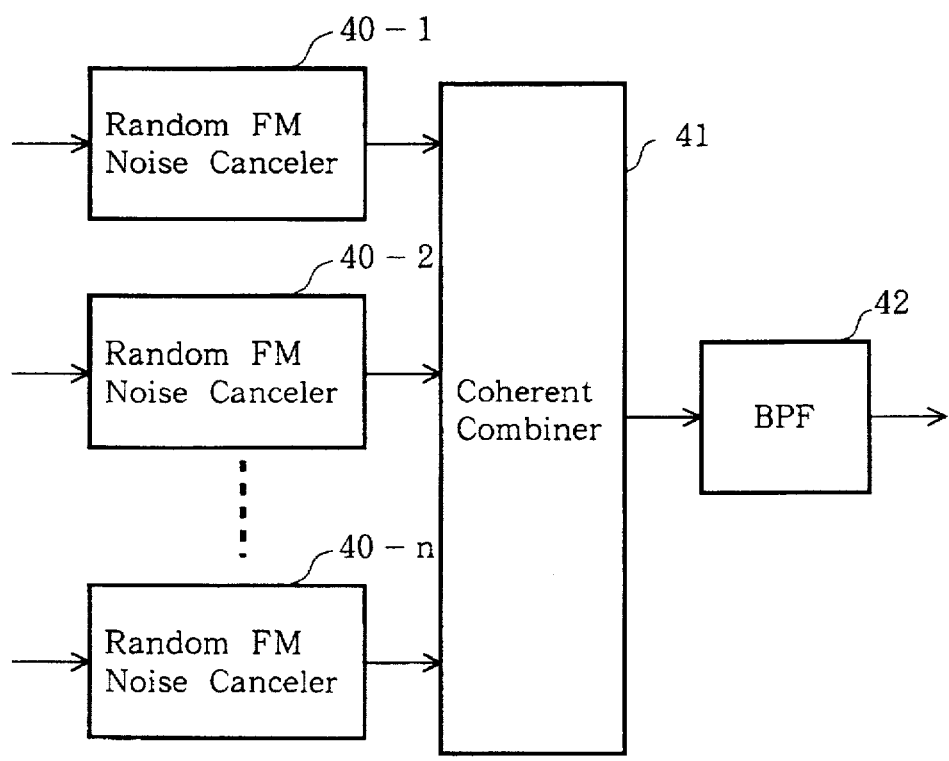
FIG. 4 is a block diagram showing an example of the utilization of this invention, and illustrates the configuration of an n-branch equal-gain combining diversity circuit.

FIG. 4 shows an n-branch equal-gain combining diversity circuit, wherein the number of branches in the example given in FIG. 3 has been increased.

This circuit has, as random noise cancelers 40-1~40-n, n of the circuits taught in the first embodiment or the second embodiment. It also has coherent combiner 41 which coherently combines the respective output signals of these random noise cancelers 40-1~40-n, and band-pass filter 42. Because signals which have had their random FM noise eliminated are respectively obtained at the outputs of random noise cancelers 40-1~40-n, these signals are arranged in parallel and are all combined coherently by coherent combiner 41. Spurious components contained in the combined signal are removed by means of band-pass filter 42. This results in an equal-gain combined signal being obtained.

Figure 5:
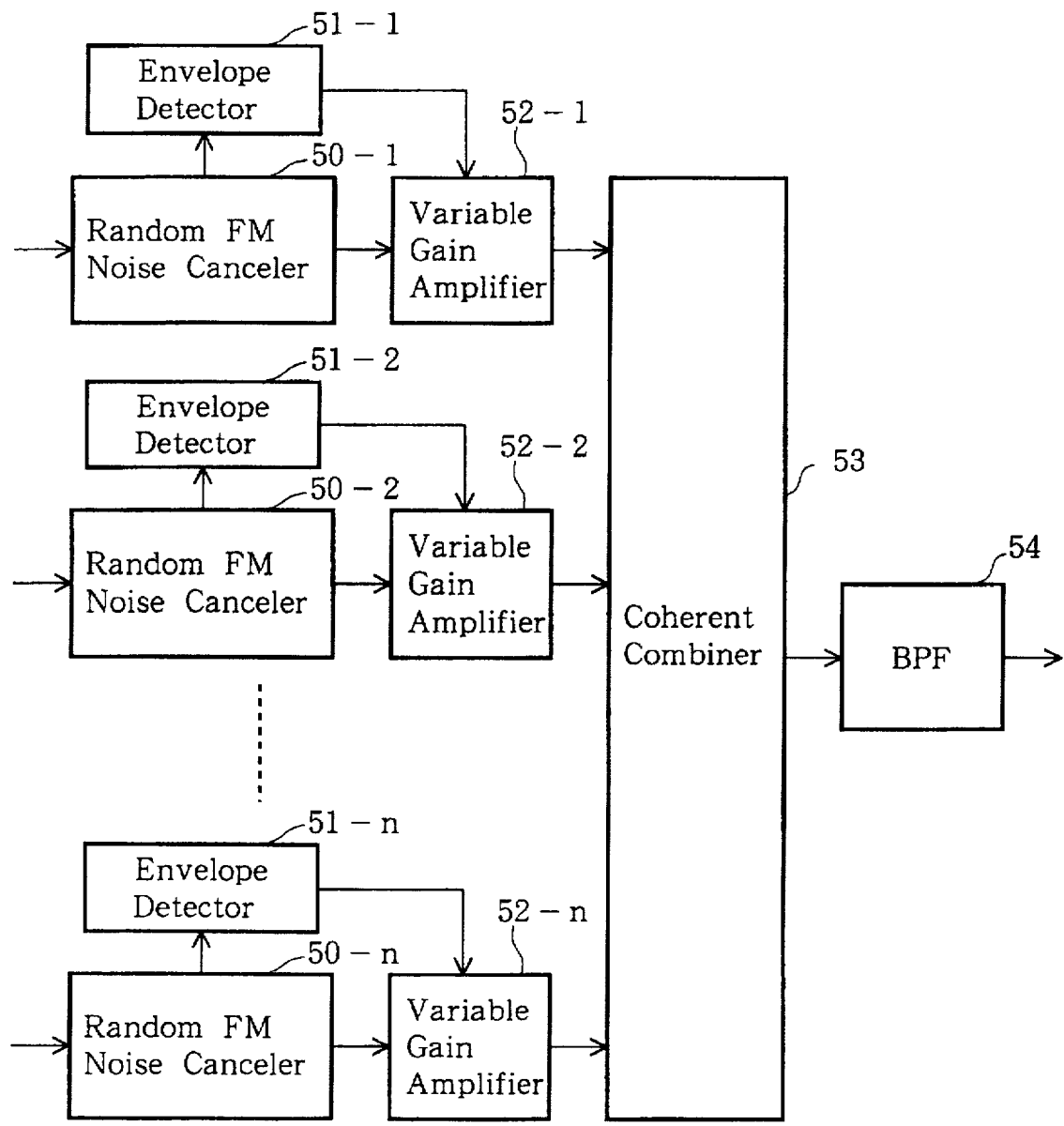
FIG. 5 is a block diagram showing another example of the utilization of this invention, and illustrates the configuration of an n-branch maximum-ratio combining diversity circuit.

FIG. 5 is a block diagram showing another example of the utilization of this invention, and illustrates an n-branch maximum ratio combining diversity circuit.

This circuit has: n of the circuits taught in the first embodiment or the second embodiment, the circuits serving as random FM noise cancelers 50-1~50-n; envelope detectors 51-1~51-n and variable-gain amplifiers 52-1~52-n serving as means for amplifying the output signals of these random FM noise cancelers on the basis of the signal level of the pilot signal that has been extracted by the respective random FM noise cancelers; coherent combiner 53 which coherently adds the outputs of variable-gain amplifiers 52-1~52-n; and band-pass filter 54 for removing spurious components from the output of coherent combiner 53.

Envelope detector 51-i (i=1~n) detects the level of the pilot signal that is output from band-pass filter 14 or 16 in random FM noise canceler 50-i. The gain of amplification of variable-gain amplifier 52-i changes in proportion to the output signal level of envelope detector 51-i, thereby adjusting the output level of random FM noise canceler 50-i. Coherent combiner 53 combines the outputs of variable-gain amplifiers 50-1~50-n by addition. The number of branches n is usually set at n=2.

In this example, envelope detectors have been provided separately from the random FM noise cancelers, but if the envelope detectors have been integrated in the amplitude limiters (17 in FIG. 1 and FIG. 2), these may be utilized instead.

Figure 6:
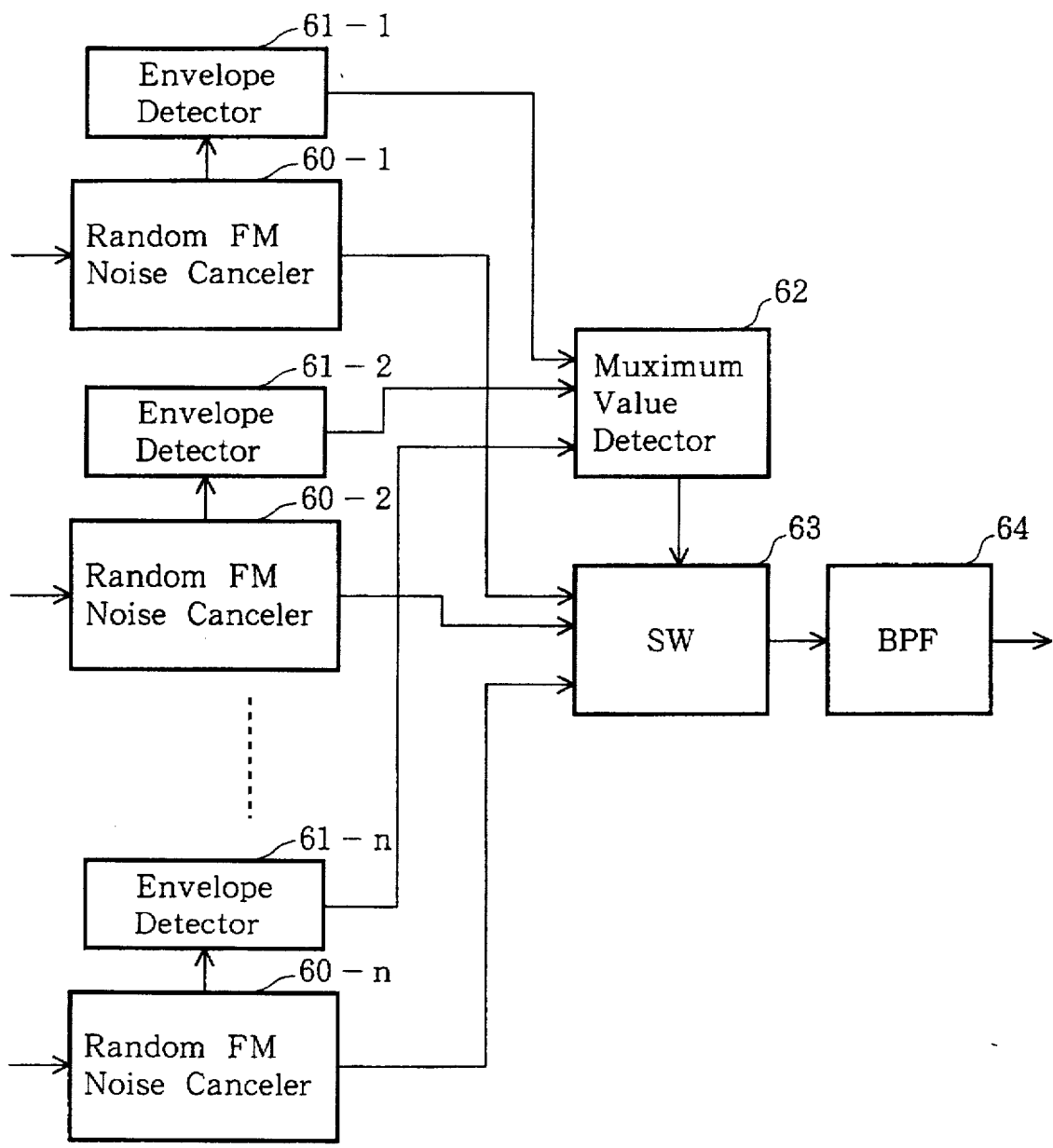
FIG. 6 is a block diagram showing still another example of the utilization of this invention, and illustrates an n-branch selective combining diversity circuit.

FIG. 6 is a block diagram showing still another example of the utilization of this invention, and illustrates an n-branch selective combining diversity circuit.

This circuit has: n of the circuits taught in the first embodiment or the second embodiment, said circuits serving as random FM noise cancelers 60-1~60-n; envelope detectors 61-1~61-n and maximum value detector 62 serving as a means which compares the signal levels of the pilot signals that have been extracted by the respective random FM noise cancelers, and which detects the largest of these; switching circuit 63 serving as a means which, on the basis of the output of this maximum value detector 62, selects and puts out the output signal of one of the plurality of random FM noise cancelers 60-1~60-n; and band-pass filter 64 for removing spurious components from the output of switching circuit 63.

Envelope detector 61-i (i=1~n) detects the level of the pilot signal that is the output from band-pass falter 14 or 16 in random FM noise canceler 60-i. Maximum value detector 62 decides, from the output signals of envelope detectors 61-1~61-n, which branch exhibits the maximum value, and puts out the result of this decision to switching circuit 63. Switching circuit 63 switches branches in accordance with this decision result, thereby selecting the output of one of the random FM noise cancelers 60-1~60-n. In this case as well, it is usual to use n=2.

In this example, as in the example given in FIG. 5, it is feasible to utilize envelope detectors in the amplitude limiters as envelope detectors 61-1~61-n.

In the foregoing embodiments and examples of utilization, it is also feasible to implement at least the part of the random FM noise cancelers and diversity circuits utilizing these by means of digital circuits. Namely, the required circuits from among the circuits described above are established as software for a digital signal processor (DSP). Input signals can then be converted to digital signals by an A/D converter and subjected to digital operations in the digital signal processor, with the results being output after conversion to analog signals by means of a D/A converter. In this case, the frequency of the input signal has to be reduced to the frequency region in which the digital signal processor operates: for example, to several tens of kHz. There are several advantages when this invention is thus implemented by means of a digital signal processor, namely: the entire circuit is integrated into LSI which can be produced at lower cost, and the signal processing is invariably accurate.

Figure 7:
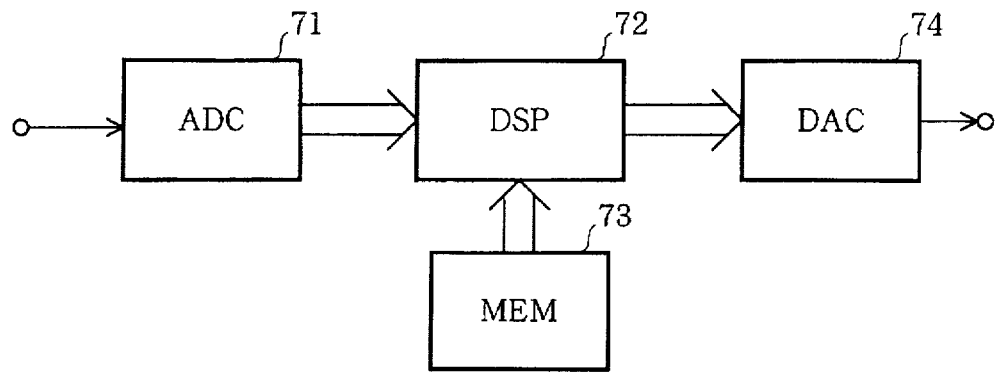
FIG. 7 is a block diagram showing an embodiment employing a digital signal processor.
Figure 8:
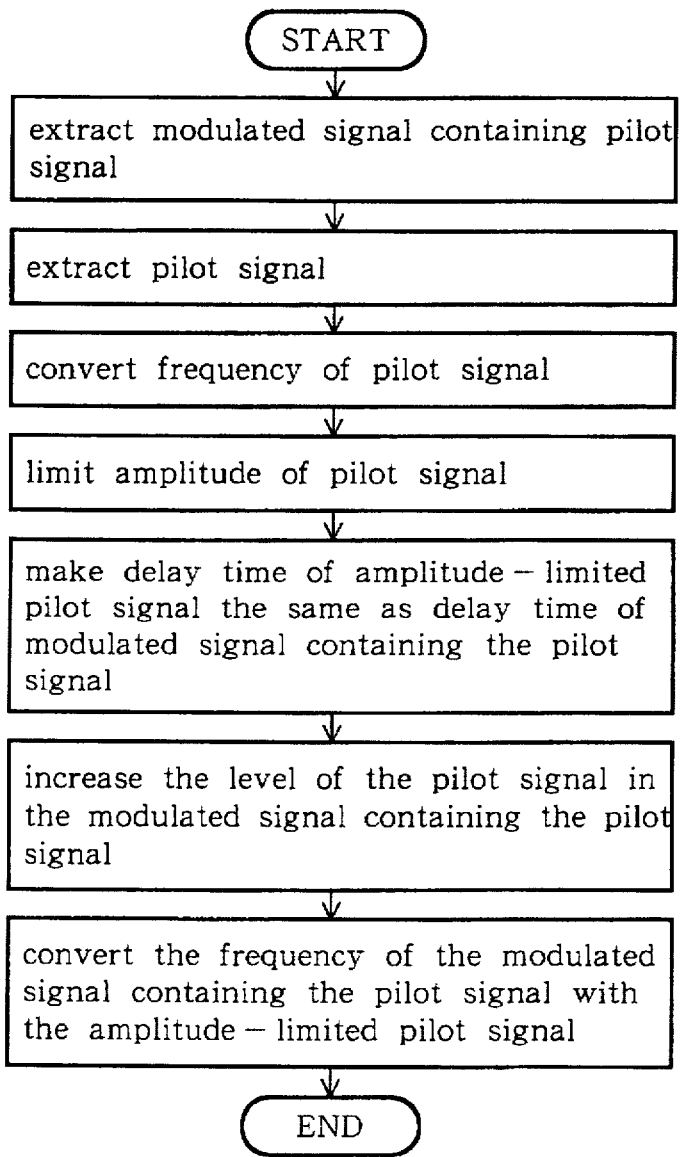
FIG. 8 shows the processing flow in a digital signal processor.

FIG. 7 and FIG. 8 show an example of the implementation, using a digital signal processor, of a random FM noise canceler that is equivalent to the second embodiment illustrated in FIG. 2. FIG. 7 shows the circuit configuration, while FIG. 8 shows the processing signal flow for the digital signal processor. In this example, a frequency conversion is carried out in the receiver so that the center frequency selects 15 kHz, and after spurious components have been removed, the input signal is converted to a digital signal by 16-bit A/D converter 71 with a sampling frequency of 50 kHz, and input to distal signal processor 72. If a 16-bit digital signal is used, the dynamic range of the signal will be 20 $\log 2^{16}$=96 dB, and adequate precision can be obtained even if there is a multiplicative process such as frequency conversion. Digital signal processor 72 is set so that the center frequency of band-pass filter 13 in FIG. 1 selects 5 kHz. Given this frequency allocation, the random FM canceler implemented in the embodiment shown in FIG. 1 by means of discrete circuits can be implemented by means of digital operations of digital signal processor 72 in accordance with a sequence written in memory 73. The result of the computation is converted to an analog signal by D/A converter 74.

If the sequence written in memory 73 is changed, a circuit that is equivalent to the first embodiment, shown in FIG. 1, can be implemented by digital processing. The examples given in FIG. 3 to FIG. 6 can likewise be implemented by digital processing.

Figure 9:
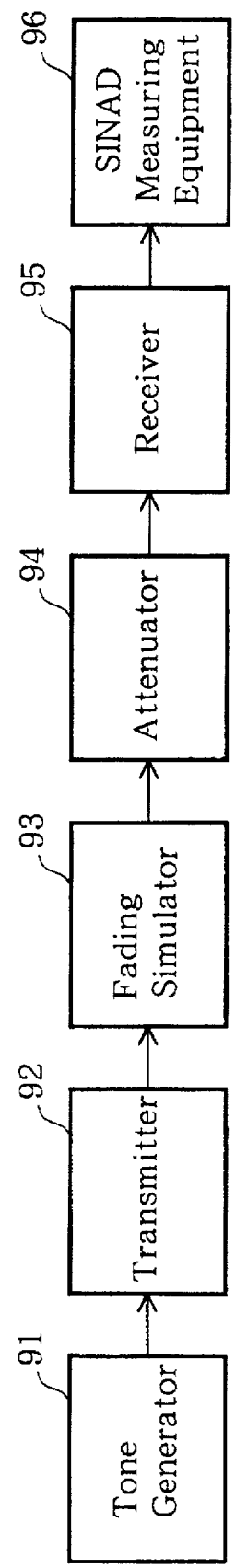
FIG. 9 is a block diagram showing laboratory equipment for measuring random FM noise cancellation characteristics.
Figure 10:
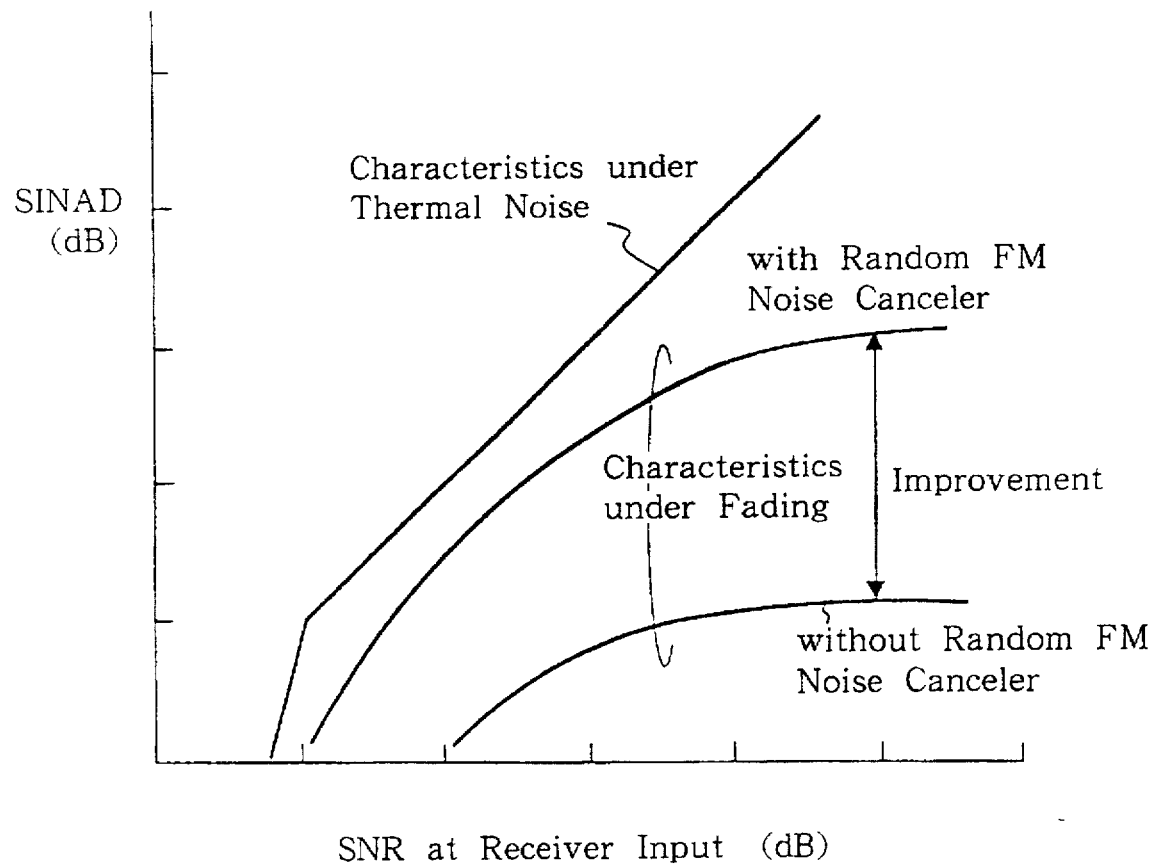
FIG. 10 shows the characteristics obtained.

FIG. 9 is an experimental set up for appraising random FM noise cancellation characteristics in a laboratory, while FIG. 10 shows the experimental results obtained.

In these measurements, the mobile radio environments were simulated by Rayleigh fading simulator 93 and attenuator 94. Attenuator 94 serves to simulate the attenuation of the signal in accordance with the distance from the base station. A 1 kHz tone signal was generated by tone signal generator 91; and this was transmitted from transmitter 92 and put into receiver 95 via Rayleigh fading simulator 93 and attenuator 94. The demodulated tone signal was then measured by SINAD measuring equipment 96. The SINAD is defined as:

$$SINAD = 10 \log[S+N+D]/[N+D] (dB)$$

where S is a signal power, N is a noise power, and D is a distortion power. The results of these measurements are given in FIG. 10. When a random FM noise canceler according to an embodiment of this invention was provided in receiver 95, the characteristics under fading were greatly improved.

As has been explained in the foregoing, a random FM noise canceler according to this invention has the following effects. It makes it possible to relax the requirements made on the band-pass filters, which of all the circuit components have the most effect on transmission quality; and enables a random FM noise canceler with excellent temperature characteristics to be obtained using a comparatively inexpensive circuit. Furthermore, because there is little delay fluctuation, equalizing the delays is easy. Moreover, signals outside the desired channel can be removed using small, inexpensive filters with amplitude characteristics that remain constant over a wide range of temperatures.

A random FM noise canceler according to this invention can provide a high-quality received signal even with ordinary reception using a single branch, i.e., when no diversity is employed, and this is because full consideration has been given to delay characteristics and the random FM noise can be eliminated. Moreover, with a two-branch or more than two-branch diversity, because the signal in each branch has its random FM noise eliminated, a high-quality received signal based on equal-gain combining diversity can be obtained using, by way of example, a circuit configuration which coherently combines the signals from all the branches.

I claim:

1. A random FM noise canceler comprising:
   first filter means for extracting a modulated signal containing a pilot signal from a high frequency band input signal, said first filter means comprising:
   first band-pass means for selecting a desired signal to be received from said high frequency band input signal,
   input frequency conversion means for converting an output of said first band-pass means to a low frequency band signal, and
   second band-pass means for extracting said modulated signal containing said pilot signal from said low frequency band signal;

second filter means for extracting said pilot signal from an output of said first filter means;

amplitude limiting means for limiting substantially an amplitude of said extracted pilot signal to a fixed value;

means for converting a frequency of said pilot signal extracted by said second band-pass means and supplying said converted frequency of said pilot signal to said amplitude limiting means;

noise cancellation means for cancelling a random FM noise component contained in both said modulated signal and said pilot signal by frequency-mixing an output of said amplitude limiting means with said modulated signal extracted by said first filter means; and delay equalizing means for equalizing delay times of said modulated signal and said pilot signal input to said noise cancellation means.

2. A random FM noise canceler according to claim 1, wherein:
   said pilot signal contained in said input signal is a signal that has been transmitted without modulation from a transmitting side at a frequency close to that of said modulated signal.

3. A random FM noise canceler according to claim 1, wherein:
   said pilot signal contained in said input signal is a carrier of said modulated signal.

4. A random FM noise canceler according to claim 3, further comprising:
   amplifying means for amplifying said pilot signal extracted by said second filter means;
   adding means for adding said amplified pilot signal to said modulated signal extracted by said second band-pass means; and
   delay equalizing means for equalizing delay times of said amplified pilot signal and said modulated signal input to said adding means;
   said modulated signal contained in said input signal is a single sideband signal with a diminished carrier.

5. A random FM noise canceler according to claim 1, 2, 3 or 4, wherein:
   at least some functions are performed by a digital signal processor.

6. An equal-gain combining diversity circuit comprising:
   a plurality of random FM noise cancelers according to claim 1, 2, 3 or 4; and
   coherent combining means for adding coherently a respective plurality of output signals of said plurality of random FM noise cancelers.

7. A maximum-ratio combining diversity circuit comprising:
   a plurality of random FM noise cancelers according to claim 1, 2, 3 or 4;
   amplifying means for amplifying a respective plurality of output signals of said plurality of random FM noise cancelers on a basis of a signal level of said pilot signal extracted by respective ones of said plurality of random FM noise-cancelers; and
   coherent combining means for adding coherently respective outputs of said amplifying means.

8. Selective combining diversity circuit comprising:

a plurality of random FM noise cancelers according to claim 1, 2, 3 or 4;

detecting means for comparing signal levels of a respective plurality of pilot signals extracted by said plurality of random FM noise cancelers and detecting a maximum of said respective plurality of pilot signals; and selecting means for selecting and outputting an output signal of one of said plurality of random FM noise cancelers on a basis of an output of said detecting means.

9. A random FM noise canceler comprising:

a first filter to extract a modulated signal containing a pilot signal from a high frequency band input signal, said first filter comprising:
- a first band-pass filter which selects a desired signal to be received from said high frequency band input signal,
- an input frequency converter to convert an output of said first band-pass filter to a low frequency band signal, and
- a second band-pass filter to extract said modulated signal containing said pilot signal from said low frequency band signal;

a second filter to extract said pilot signal from an output of said first filter;

a amplitude limiter to limit substantially an amplitude of said extracted pilot signal to a fixed value;

a frequency converter to convert a first frequency of said pilot signal extracted by said second band-pass filter to a converted frequency, said converted frequency being input to said amplitude limiter;

a noise canceler to cancel a random FM noise component contained in both said modulated signal and said pilot signal; and a delay to equalize delay times of said modulated signal and said pilot signal input to said noise canceler.

10. A method of cancelling random FM noise comprising steps of:

extracting a modulated signal containing a pilot signal from a high frequency band input signal, by steps of:
- selecting a desired signal to be received from said high frequency band input signal,
- converting an output of said first band-pass filter to a low frequency band signal, and
- extracting said modulated signal containing said pilot signal from said low frequency band signal;

extracting said pilot signal from an output of said first filter;

converting a first frequency of said extracted pilot signal to a converted frequency;

limiting substantially an amplitude of said converted frequency to a fixed value;

equalizing delay times of said modulated signal and said pilot signal; and cancelling a random FM noise component contained in both said modulated signal and said pilot signal.

* * * * *